United States Patent [19]

Yonezawa et al.

[11] Patent Number: 5,475,825
[45] Date of Patent: Dec. 12, 1995

[54] SEMICONDUCTOR DEVICE HAVING COMBINED FULLY ASSOCIATIVE MEMORIES

[75] Inventors: Hirokazu Yonezawa, Hyogo; Seiji Yamaguchi, Osaka, both of Japan

[73] Assignee: Matsushita Electric Industrial Co., Ltd., Osaka, Japan

[21] Appl. No.: 952,990

[22] Filed: Sep. 29, 1992

[30] Foreign Application Priority Data

Oct. 1, 1991 [JP] Japan .................................. 3-253221

[51] Int. Cl.⁶ .......................... G06F 12/10; G06F 13/00; G11C 15/00
[52] U.S. Cl. ...................... 395/401; 395/432; 395/435; 365/49; 364/DIG. 1
[58] Field of Search .................................. 395/400, 425; 365/49

[56] References Cited

U.S. PATENT DOCUMENTS

| | | | |
|---|---|---|---|
| 4,785,398 | 11/1988 | Joyce et al. | 395/425 |
| 5,053,951 | 10/1991 | Nusinov et al. | 395/425 |
| 5,133,058 | 7/1992 | Jensen | 395/400 |
| 5,283,882 | 2/1994 | Smith et al. | 395/425 |
| 5,289,414 | 2/1994 | Hatsuda | 365/189.07 |

FOREIGN PATENT DOCUMENTS 64-207716  3/1991  Japan .

*Primary Examiner*—Michael A. Whitfield
*Attorney, Agent, or Firm*—Willian Brinks Hofer Gilson & Lione

[57] ABSTRACT

As a TLB (translation look-aside buffer) of a fully associative system is organized, a first CAM (content addressable memory) cell array and a first RAM (random access memory) cell array which together make up one entry are arranged in such a way that they face each other across a control circuit. As a cache memory of a fully associative system is organized, a second CAM cell array and a second RAM cell array which together make up one entry are arranged in such a way that they face each other across the control circuit. Additionally, the second CAM cell array is located next to the first RAM cell array, whereas the second RAM cell array is located next to the first CAM cell array. These four cell arrays make up one section. At the time of a hit in the first CAM cell array, the control circuit enables readout of the first RAM cell array, while it, at the time of a hit of the second CAM cell array, enables readout of the second RAM cell array. Based on logical addresses issued to the first CAM cell array, physical addresses are read from the first RAM cell array. Such physical addresses are supplied to the second CAM cell array as tags for the readout of data from the second RAM cell array.

8 Claims, 11 Drawing Sheets

SEMICONDUCTOR DEVICE HAVING COMBINED FULLY ASSOCIATIVE MEMORIES

BACKGROUND OF THE INVENTION

This invention relates to a semiconductor memory device that contains a plurality of associative memories.

In recent years, there has been a tendency that many high-speed, large scale integrated semiconductor memory devices contain a plurality of associative memories. Typical associative memories include a translation look-aside buffer (TLB) to support virtual memory system, and a cache memory to achieve a fast access to data, particularly one that is accessed by physical addresses. Full-associative system has increasingly been employed because of its high hit rate. Meanwhile, a microprocessing unit (MPU), composed of a central processing unit (CPU) and a semiconductor memory unit with plural associative memories mounted on the same chip, is also used in many applications.

As an example, one principal operation of an MPU containing a TLB and a cache memory is described below. A logical address is first issued to the TLB. The TLB in return outputs a physical address corresponding to the logical address. Such a physical address is supplied to a tag memory in the cache memory. Data corresponding to the physical address is output from a data memory in the cache memory. For the above-described MPU containing the TLB and the cache memory, the transmission of the physical address from the TLB to the cache memory (i.e., the data transmission from one associative memory to another) is required.

However, the TLB and the cache memory are conventionally regarded as different, independent functional blocks, and they are kept separate at different locations within a chip. Data transmission time necessary for transmitting data from the TLB to the cache memory has been one of the causes that prevent the MPU from operating at high speed. Further, a large wiring area is inevitably required for connection between the TLB and the cache memory, which is an obstacle to the improvement of the integration of semiconductor memory device.

Therefore, a principal aim of the present invention is that, in a semiconductor memory device incorporating therein a plurality of associative memories, high-speed data transmission between the associative memories is accomplished while having the integration of semiconductor memory device improved.

DISCLOSURE OF THE INVENTION

To achieve the above aim, in accordance with the present invention, a plurality of associative memories are integrally formed. More specifically, a semiconductor memory device of the present invention is provided with a first associative memory means and a second associative memory means. Each one of the two associative memory means has a content addressable memory (CAM) cell array and a RAM (random access memory) cell array. In the semiconductor memory device, the one associative memory means is combined with the other associative memory means in such a manner that one entry of each associative memory means makes up one unit. In other words, a first CAM cell array and a first RAM cell array are arranged in the way that a first associative memory means of full-associative system is organized so that they (the first CAM cell array and the first RAM cell array) face each other across a control means. On the other hand, a second CAM cell array and a second RAM cell array are arranged in the way that a second associative memory means of full-associative system is organized so that they (the second CAM cell array and the second RAM cell array) face each other across the control means. Additionally, the second CAM cell array is located next to the first RAM cell array. Similarly, the second RAM cell array is located next to the first CAM cell array. The control means combines the function of transmitting signals from the first CAM cell array to the first RAM cell array with that of transmitting signals from the second CAM cell array to the second RAM cell array. Pairs of bit lines for the first CAM cell array and pairs of bit lines for the second RAM cell array are arranged at the one side of the control means so as not to cross each other. Pairs of bit lines for the first RAM cell array and pairs of bit lines for the second CAM cell array are arranged at the other side of the control means so as not to cross each other.

For example, when the first associative memory means makes up a TLB (translation look-aside buffer) while the second associative memory means makes up a cache memory, the first CAM cell array stores logical addresses while the first RAM cell array stores physical addresses corresponding to the logical addresses stored in the first CAM cell array. The second CAM cell array is used as a cache tag memory. The second RAM cell array is used as a cache data memory. That is, the physical address, read from the first RAM cell array on the basis of the logical address issued to the first CAM cell array for comparison, is supplied to the second CAM cell array as a tag to read data out of the second RAM cell array. The first RAM cell array and the second CAM cell array are close together, that is to say, the physical address travels just a short transmission distance between the two associative memory means. Thus, high-speed transmission can be achieved. Further, wiring areas between the two associative memory means can be reduced for the same reason as above, which results in the improvement of the integration of semiconductor memory device.

Generally, the configuration of CAM cells is more complicated than that of RAM cells, so that a CAM cell array for one entry usually requires more space than a RAM cell array for one entry. In view of this, if one associative memory means is independently arranged away from the other associative memory means, a waste of space is produced in each of the associative memory means.

In the present invention, however, the two associative memory means are arranged in an effective mixed-up manner, as described above. Thus, the confined space can effectively be utilized. The integration can be much improved, accordingly.

For practical applications, a unit composed of the foregoing first and second CAM cell arrays, the first and second RAM cell arrays, and the control means further includes a first decoder that is used at the time of the write operation to the first CAM cell array, and a second decoder that is used at the time of the write operation to the second CAM cell array.

If the first RAM cell array and the second CAM cell array both locating at the one side of the control means share the same pair of signal lines as a pair of bit lines, wiring areas in use of pairs of bit lines can be much reduced. Capacitance can be reduced owing to the share of a pair of bit lines. This results in the fact that less power is required.

Apart from the above application in which one of the two associative memory means is used as a TLB and the other as a cache memory, there may be another application as follows. In the event that a CPU is employed which distinctively outputs instruction logical addresses and data logical addresses, it is possible to use one of the two associative memory means as an instruction TLB and to use the other as a data TLB. Alternatively, it is also possible to use one of the two associative memory means as an instruction cache memory and to use the other as a data cache memory.

PREFERRED EMBODIMENTS OF THE INVENTION

Referring now to the accompanying drawings, the first through sixth embodiments of the present invention will be described below.

FIRST EMBODIMENT

FIGS. 1 through 7 all relate to the semiconductor memory device with a TLB and a cache memory according to the first embodiment of the invention.

Figure 1:
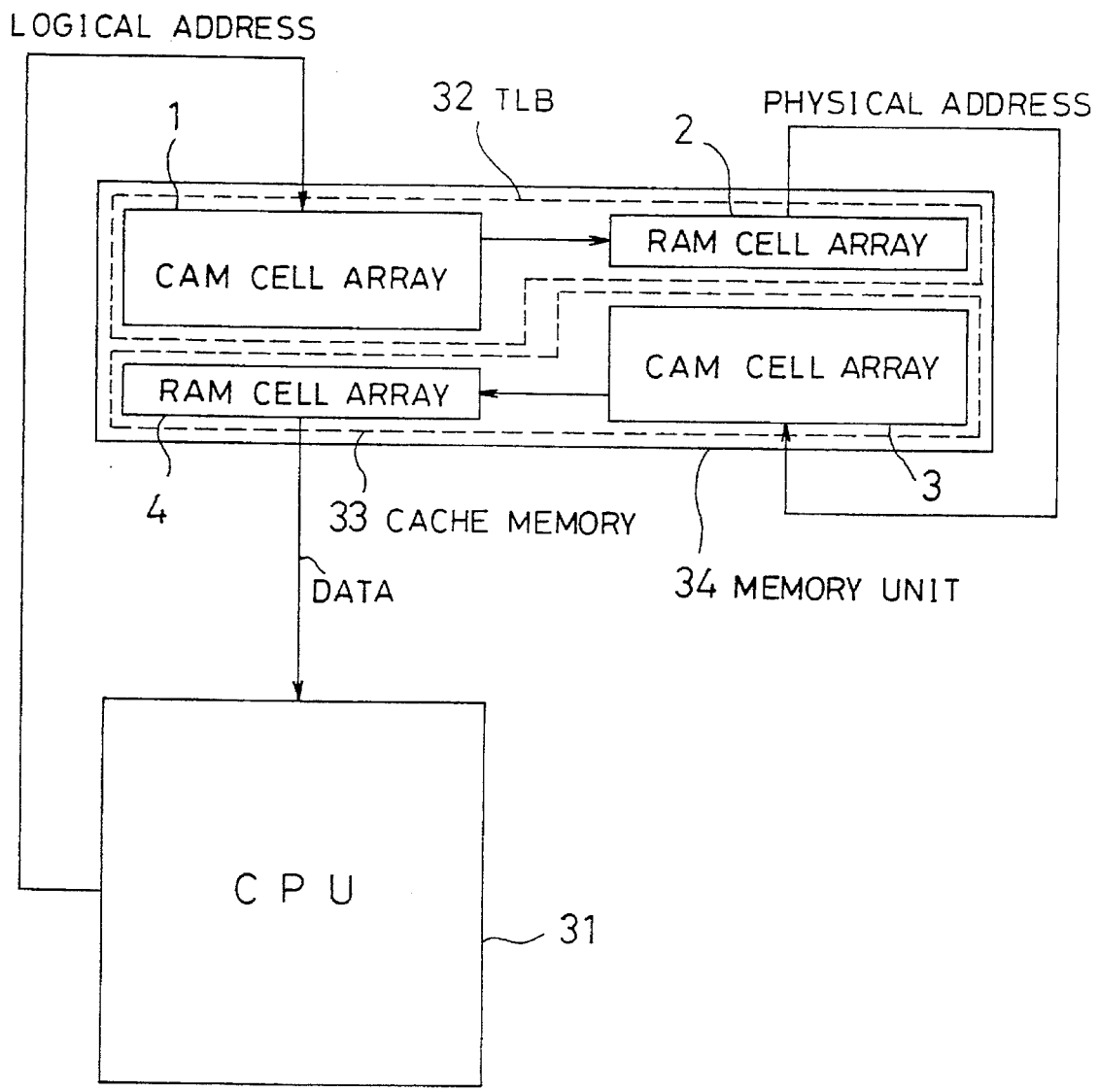
FIG. 1 is a block diagram, simplified, illustrating an MPU containing a semiconductor memory unit with a TLB and a cache memory of a first embodiment of the present invention, for the purpose of describing the function of the semiconductor memory unit.

An MPU of FIG. 1 contains therein a CPU 31, and a memory unit 34 that serves as the semiconductor memory device of the first embodiment. The memory unit 34 has a TLB 32 and a cache memory 33. The TLB 32 is a first associative memory of full-associative system which is composed of a first CAM cell array 1 and a first RAM cell array 2. The cache memory 33 is a second associative memory of full-associative system which is composed of a second CAM cell array 3 and a second RAM cell array 4.

The function of the memory unit 34 will be described. The TLB 32 is first supplied with a logical address issued from the CPU 31. The first CAM cell array 1 compares such a logical address supplied to the TLB 32 with a logical address stored in the first CAM cell array 1. If the two logical addresses agree with each other, a physical address is read out of the corresponding first RAM cell array 2. Then the physical address is fed to the cache memory 33, which is then compared, by the second CAM cell array 3 as a cache tag memory, with a tag stored in the second CAM cell array 3. If the physical address and the tag agree with each other, data is read out of the second RAM cell array 4 as the corresponding cache data memory. The CPU 31 receives the data read out of the cache memory 33. The flows of addresses and data, at the time of the write operations to the first and second CAM cell arrays 1 and 3, and to the first and second RAM cell arrays 2 and 4 performed by the CPU 31, have been left out of FIG. 1.

Figure 2:
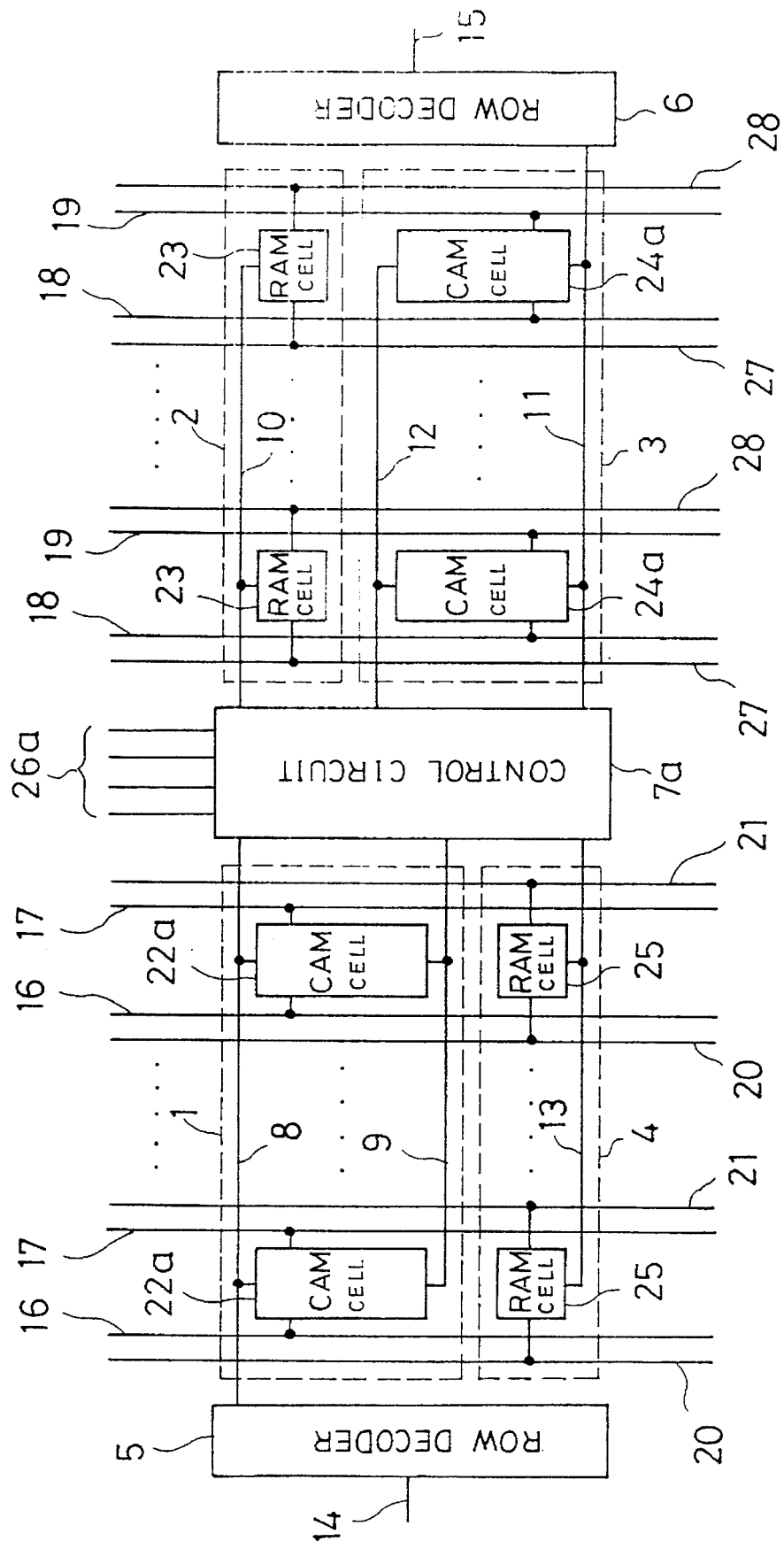
FIG. 2 is a block diagram showing the organization of one section composed of a combination of the TLB for one entry and the cache memory for one entry in the semiconductor memory unit of FIG. 1.

In FIG. 2, the organization of one section, made up of a combination of the TLB 32 for one entry and the cache memory 33 for one entry in the memory unit 34, is shown. In addition to the first CAM cell array 1 and the first RAM cell array 2 which together make up the TLB 32, and the second CAM cell array 3 and the second RAM cell array 4 which together make up the cache memory 33, this section further includes first and second row decoders 5 and 6, and a control circuit 7a. The first and second row decoders 5 and 6 are used at the time of the write operations to the first and second CAM cell arrays 1 and 3 respectively, wherein entries for the write operations are designated through first and second address signal lines 14 and 15 respectively. Based on plural signals on control signal lines 26a, the control circuit 7a controls the transmission of signals from the first CAM cell array 1 to the first RAM cell array 2, and further controls the transmission of signals from the second CAM cell array 3 to the second RAM cell array 4.

The first CAM cell array 1 is composed of m CAM cells 22a. Each one of the CAM cells 22a is connected to a first word line 8, first and second bit lines (a first pair of bit lines) 16 and 17, and a first sense line 9. The first word line 8 with a common connection to each one of the CAM cells 22a is further connected to the first row decoder 5, and further to the control circuit 7a. Signals on the first sense line 9 with a common connection with each one of the CAM cells 22a are fed to the control circuit 7a. The first RAM cell array 2 is composed of n RAM cells 23. Each one of the RAM cells 23 is connected to a second word line 10 extending from the control circuit 7a, third and fourth bit lines (a second pair of bit lines) 27 and 28.

The second CAM cell array 3 is composed of n CAM cells 24a. Each one of the CAM cells 24a is connected to a third word line 11, fifth and sixth bit lines (a third pair of bit lines) 18 and 19, and a second sense line 12. The third word line 11 with a common connection to each one of the CAM cells 24a is further connected to the second row decoder 6, and to the control circuit 7a. Signals on the second sense line 12 with a common connection with each one of the CAM cells 24a are fed to the control circuit 7a. The second RAM cell array 4 is composed of m RAM cells 25. Each one of the RAM cells 25 is connected to a fourth word line 13 extending from the control circuit 7a, seventh and eighth bit lines (a fourth pair of bit lines) 20 and 21.

The first CAM cell array 1 and the first RAM cell array 2 are arranged so that these two cell arrays face each other across the control circuit 7a. Similarly, the second CAM cell array 3 and the second RAM cell array 4 are arranged so that they face each other across the control circuit 7a. Additionally, the second CAM cell array 3 and the first RAM cell array 2 are located next to each other, while the second RAM cell array 4 and the first CAM cell array 1 are located next to each other. Further, the first and second bit lines 16 and 17, and the seventh and eighth bit lines 20 and 21 are arranged not to cross each other, on the one side of the control circuit 7a. The third and fourth bit lines 27 and 28, and the fifth and sixth bit lines 18 and 19 are arranged not to cross each other, on the other side of the control circuit 7a.

Figure 3:
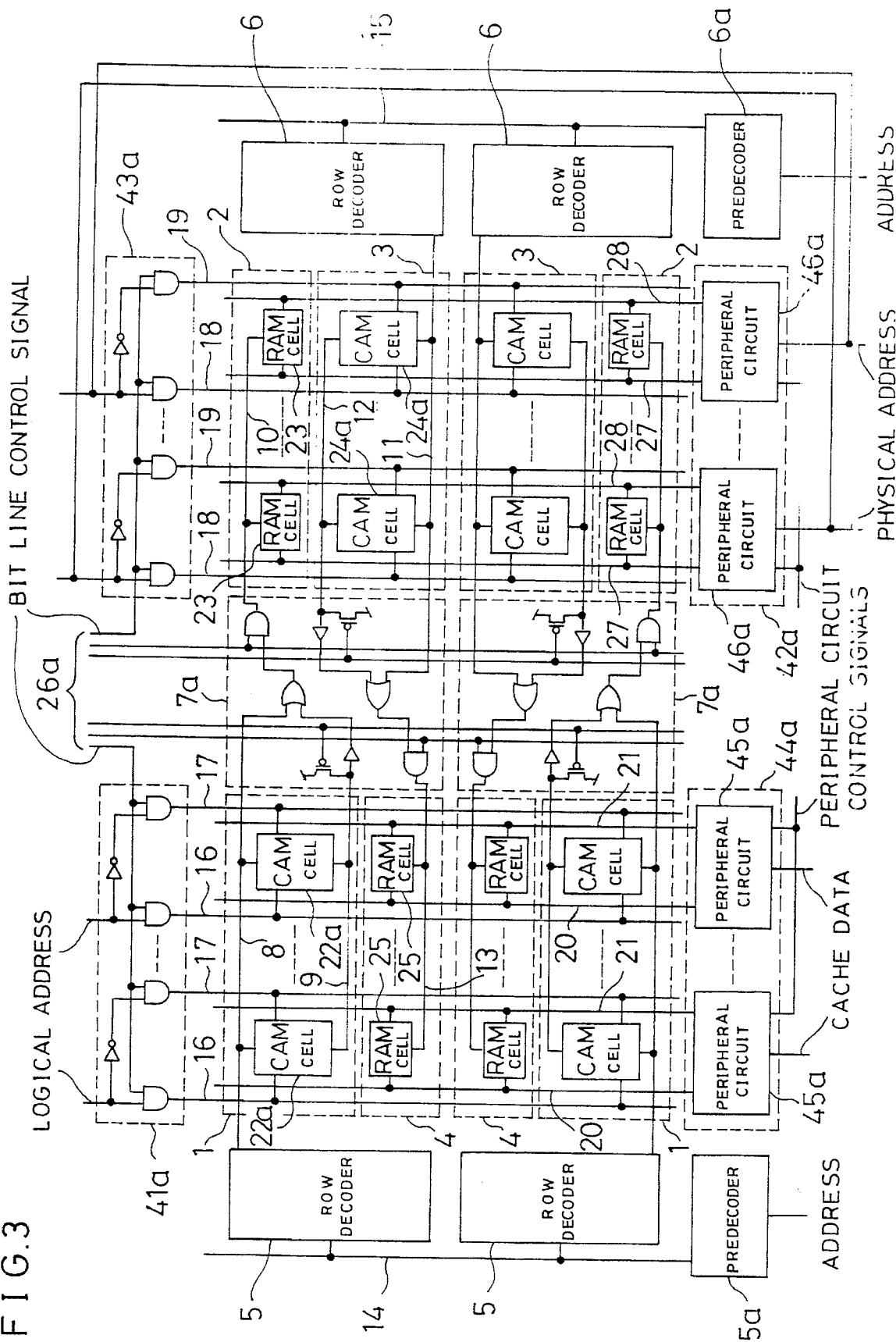
FIG. 3 is a block diagram showing the whole internal organization of the semiconductor memory unit of FIG. 1.

FIG. 3 illustrates the whole memory unit 34 composed of a plurality of sections each having the organization of FIG. 2 which are arranged with the extension of each bit line. Not less than three sections are actually provided, although FIG. 3 shows only a couple of sections. All of the sections share: the first and second address signal lines 14 and 15; the first and second bit lines 16 and 17; the third and fourth bit lines 27 and 28; the fifth and sixth bit lines 18 and 19; the seventh and eighth bit lines 20 and 21; and the control signal lines 26a.

Further included in FIG. 3 are first and second predecoders 5a and 6a, first and second CAM input circuits 41a and 43a, and first and second RAM input/output (I/O) circuits 42a and 44a. The first and second predecoders 5a and 6a drive the first and second address signal lines 14 and 15, respectively. The first CAM input circuit 41a applies, for the first CAM cell array 1, a potential difference between the first and second bit lines 16 and 17 according to input logical addresses, when a bit line control signal becomes "HIGH". The second CAM input circuit 43a applies, for the second CAM cell array 3, a potential difference between the fifth and sixth bit lines 18 and 19 according to physical addresses, when another bit line control signal becomes "HIGH". The first RAM I/O circuit 42a has n peripheral circuits 46a for access to the first RAM cell array 2. The second RAM I/O circuit 44a, on the other hand, has m peripheral circuits 45a for access to the second RAM cell array 4. The physical address, read from the first RAM cell array 2 via the first RAM I/O circuit 42a, is supplied to the second CAM cell array 3 via the second CAM input circuit 43a.

Figure 4:
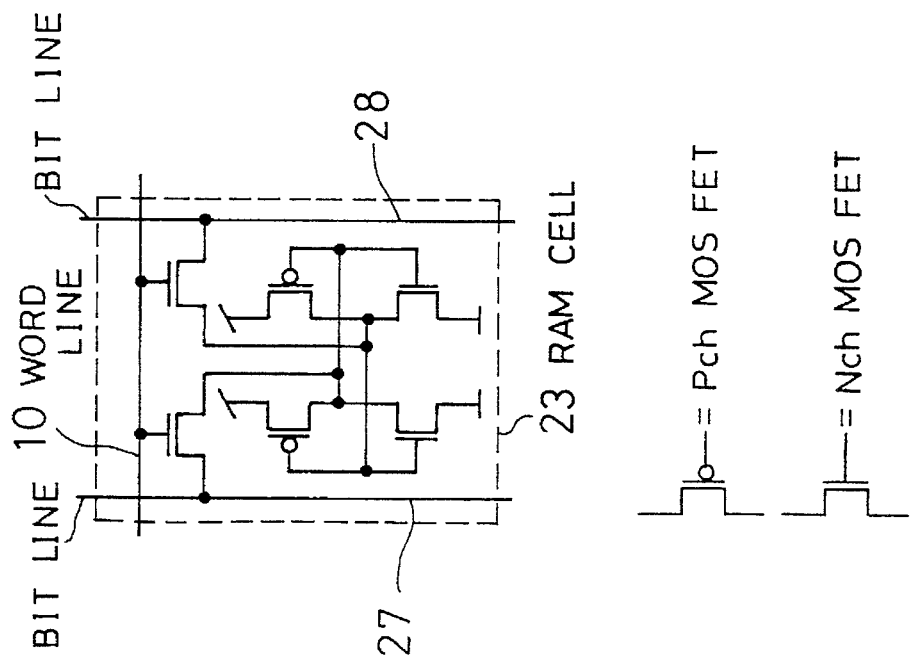
FIG. 4 is a circuit diagram showing the internal organization of a single RAM cell of FIGS. 2 and 3.

FIG. 4 illustrates a circuit of one RAM cell 23 in the first RAM cell array 2, as an example. The RAM cell 23 is composed of two p-channel MOS field-effect transistors (PchMOSFET) and four n-channel MOS field-effect transistors (NchMOSFET). At the time of the readout operation, the two bit lines 27 and 28 are precharged to "HIGH". Then the word line 10 is brought to "HIGH". As a result, information stored in the cell is read, and there appears a potential difference between the bit lines 27 and 28. At the time of the write operation, the word line 10 is brought to "HIGH", thereafter, a potential difference is applied between the bit lines 27 and 28. As a result, information is written to the cell. The organization of the RAM cell 25 ,in the second RAM cell array 4 is the same as FIG. 4.

Figure 5:
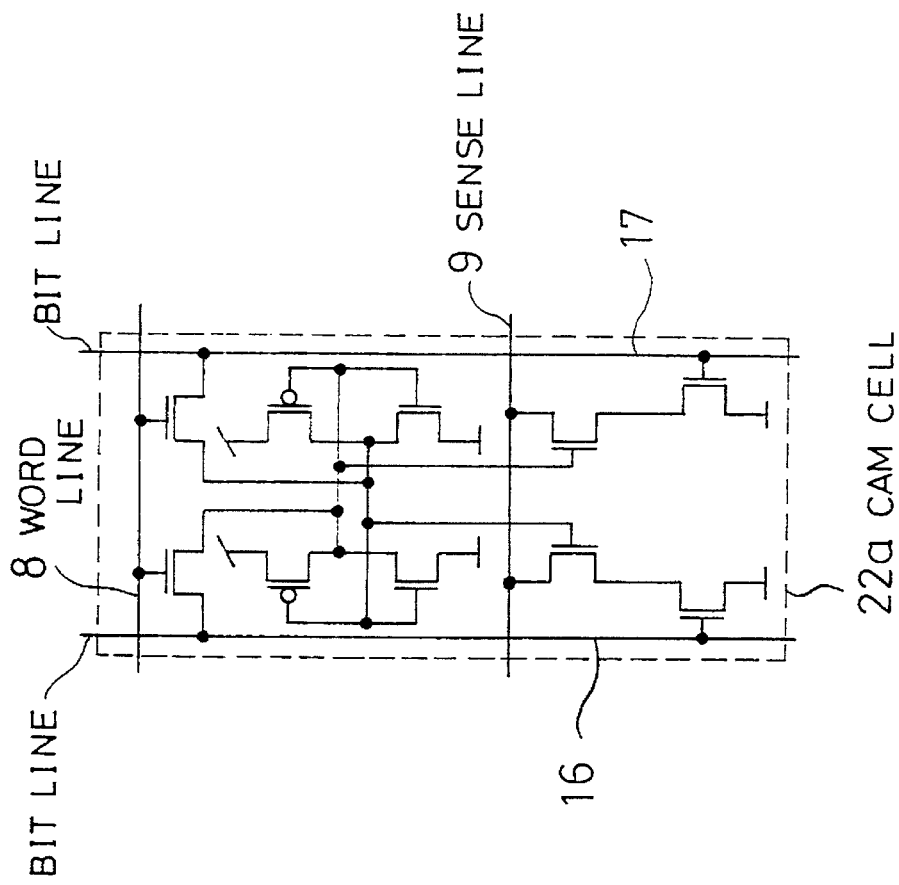
FIG. 5 is a circuit diagram showing the internal organization of a single CAM cell of FIGS. 2 and 3.

FIG. 5 illustrates a circuit of one CAM cell 22a in the first CAM cell array 1, as an example. The CAM cell 22a is composed of two PchMOSFET and eight NchMOSFET. At the time of the write operation, the word line 8 is brought to "HIGH", thereafter, a potential difference is applied between the bit lines 16 and 17. As a result, information is written to the cell. At the time of the comparing operation, the CAM input circuit 41a is first supplied with a "LOW" bit line control signal, as a result of which the bit lines 16 and 17 become "LOW". With this state (that is, with the bit lines 16 and 17 in the state of "LOW"), the sense line 9 is precharged to "HIGH" from outside. Then a comparison potential difference is applied between the bit lines 16 and 17 from the CAM input circuit 41a to compare the information on the bit lines 16 and 17 with the other stored in the cell. If a hit (successful comparison of two items of information) is sensed, the potential of the sense line 9 stays unchanged. If a miss (unsuccessful comparison of two items of information) is sensed, the potential of the sense line 9 changes to "LOW". The organization of the CAM cell 24a in the second CAM cell array 3 is the same as FIG. 5.

Figure 6:
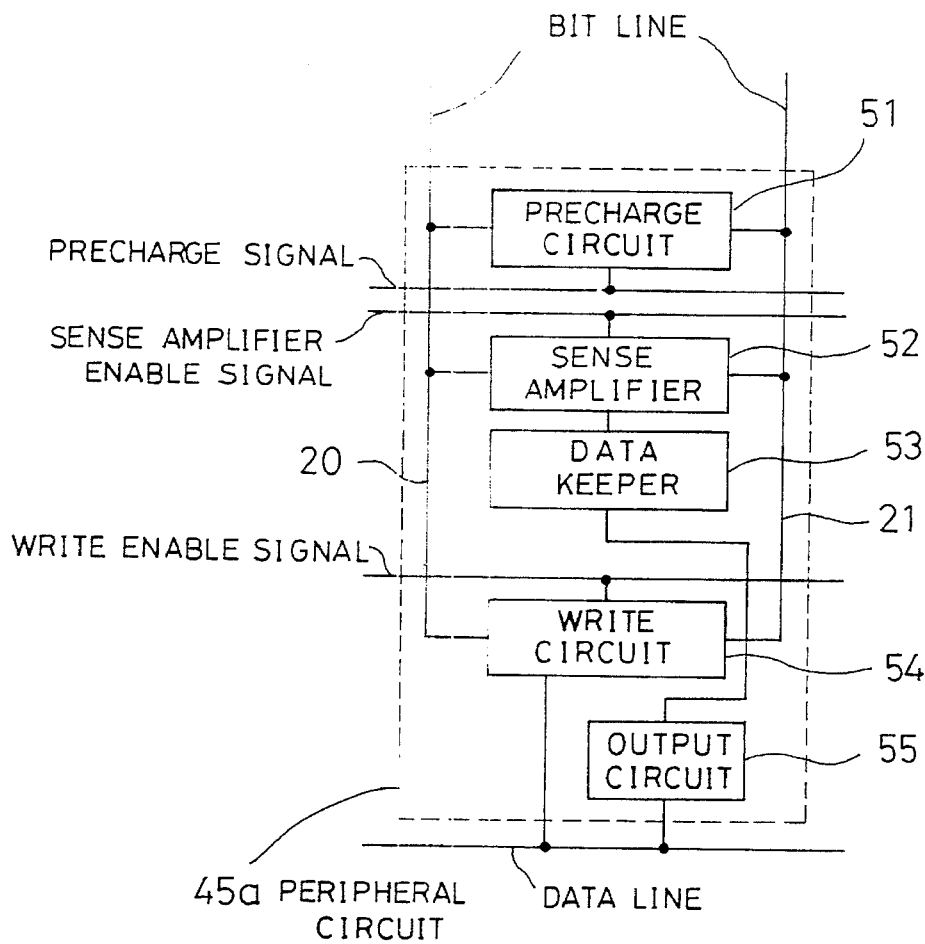
FIG. 6 is a block diagram showing the internal organization of a peripheral circuit for one bit of FIG. 3 for the readout and write of the RAM cell.

FIG. 6 shows a sample organization of the peripheral circuit 45a for one bit in the second RAM I/O circuit 44a for the readout and write of the RAM cell 25. The peripheral circuit 45a of FIG. 6 includes a precharge circuit 51, a sense amplifier 52, a data keeper 53, a write circuit 54, and an output circuit 55. The precharge circuit 51, the sense amplifier 52, and the write circuit 54 are supplied with a precharge signal, a sense amplifier enable signal, and a write enable signal, respectively, as the peripheral circuit control signals. At the time of the readout operation of the RAM cell 25, the sense amplifier 52 is activated thereby amplifying data (i.e., a potential difference appeared between the two bit lines 20 and 21) read out from the RAM cell 25. The data thus amplified is taken into the data keeper 53, thereafter being supplied to an external data line via the output circuit 55. At the time of the write operation, the write circuit 54 is activated so that the data on the external data line is supplied to the bit lines 20 and 21 via the write circuit 54. When the bit lines 20 and 21 are precharged to "HIGH" before the actual readout operation, the precharge circuit 51 operates. The organization of the peripheral circuit 46a for one bit in the first RAM I/O circuit 42a is the same as FIG. 6.

Figure 7:
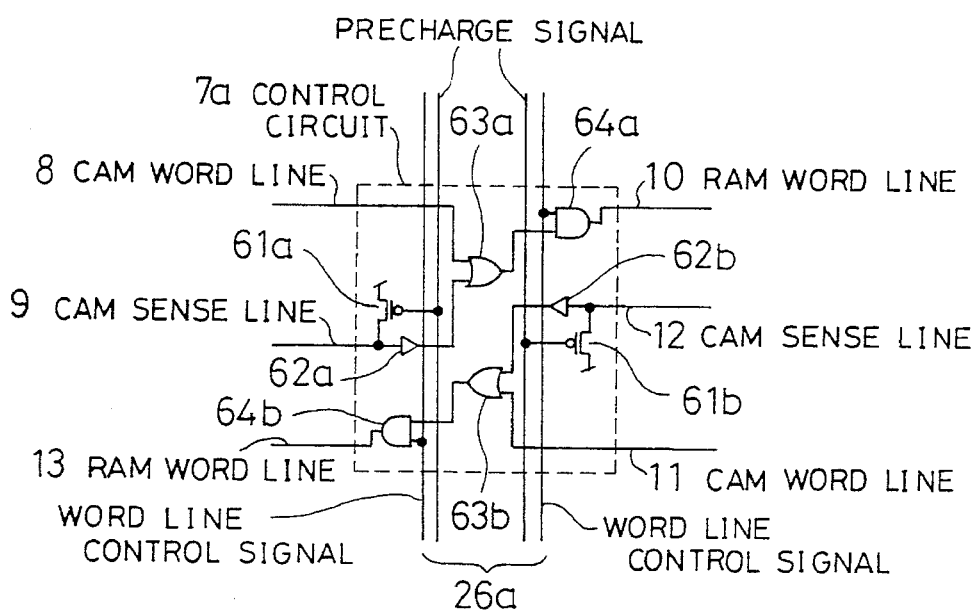
FIG. 7 is a circuit diagram showing the internal organization of a control circuit for one entry of FIGS. 2 and 3.

A sample organization of the control circuit 7a for one section is shown in FIG. 7. The control circuit 7a, under the control of plural signals on the control signal lines 26a, drives the word line 10 of the first RAM cell array 2 on the basis of a signal on the word line 8 or a signal on the sense line 9 of the first CAM cell array 1, and further drives the word line 13 of the second RAM cell array 4 on the basis of a signal on the word line 11 or a signal on sense line 12 of the second CAM cell array 3. The control circuit 7a includes two pairs of PchMOSFET's 61a and 61b, two buffers 62a and 62b, two OR gates 63a and 63b, and two AND gates 64a and 64b. In other words, the control circuit 7a is composed of two sets of identical circuits sharing precharge signals and word line control signals. The PchMOSFET 61a (61b) precharges the CAM sense line 9 (12) to "HIGH" on the basis of the precharge signal. The buffer 62a (62b) transmits a signal on the CAM sense line 9 (12) to the OR gate 63a (63b). The OR gate 63a (63b) sends out a logical sum signal of the signal fed from the buffer 62a (62b) and the signal on the CAM word line 8 (11), to the AND gate 64a (64b). The AND gate 64a (64b) outputs a logical product signal of the signal fed from the OR gate 63a (63b) and the word line control signal, onto the RAM word line 10 (13).

By way of example, the transmission of signals from the first CAM cell array 1 to the first RAM cell array 2 by means of the control circuit 7a is described below. At the time of the write operation to the CAM cell array 1 as well as to the RAM cell array 2, the precharge signal is brought to "HIGH", which allows the CAM sense line 9 to become "LOW" and yet allows the word line control signal to become "HIGH". Then the CAM word line 8 is selected and becomes "HIGH", which leads to the rise of the potential of the RAM word line 10 to "HIGH" through the OR gate 63a through the AND gate 64a. As a result of this, a word of the first RAM cell array 2 corresponding to a word of the first CAM cell array 1 is selected. At the time of the comparing operation, the word line control signal is brought to "LOW" to make the potential of the RAM word line 10 "LOW", and then the precharge signal is brought to "LOW". This causes the CAM sense line 9 to be precharged through the Pch-MOSFET 61a to "HIGH". Next, the precharge signal together with the word line control signal is brought to "HIGH". If the CAM sense line 9 keeps being "HIGH" due to a hit in the first CAM cell array 1, the potential of the RAM word line 10 is raised to "HIGH" through the buffer 62, through the OR gate 63a, and through the AND gate 64a. As a result of this, a word of the first RAM cell array 2, corresponding to a word of the first CAM cell array 1 which has been hit, is selected. Conversely, if the first CAM cell array 1 is missed, the potential of the CAM sense line 9 is lowered to "LOW". Consequently, the aforesaid word of the first RAM cell array 2 is not selected. In the same way, the transmission of signals from the second CAM cell array 3 to the second RAM cell array 4 is carried out.

Referring again to FIG. 3, the complete operation of the semiconductor memory device in accordance with this embodiment is detailed below.

In the first place, write operation to the first CAM cell array 1 as well as to the first RAM cell array 2 is described below. These two cell arrays together make up the TLB. At the time of the write operation to the first CAM cell array 1, both the first predecoder 5a, and the first row decoder 5 of each section operate to select a word to be written. When the first word line 8, connected to the first CAM cell array 1 of one of the sections, is driven to "HIGH", the first CAM input circuit 41a operates so that the non-inverted signal and the inverted signal of a logical address are supplied to the first bit line 16 and the second bit line 17, respectively. As a result of this, an m-bit logical address is written to the first CAM cell array 1 selected. Then, based on the "HIGH" signal on the first word line 8 and the word line control signal on the control signal lines 26a, the control circuit 7a drives the second word line 10 connected to the corresponding first RAM cell array 2, to "HIGH", while at the same time the non-inverted signal and inverted signal of a physical address are supplied through the first RAM I/O circuit 42a to the third bit line 27 and the fourth bit line 28, respectively. As a result, an n-bit physical address is written into the first RAM cell array 2 selected. Similarly, the write of an n-bit physical address into the second CAM cell array 3 as a cache tag memory, and the write of m-bit data into the second RAM cell array 4 as a cache data memory are accomplished by means of the second predecoder 6a, the second row decoder 6, the second CAM input circuit 43a, the control circuit 7a, and the second RAM I/O circuit 44a.

Readout operation is described below, which uses an physical address generated in the TLB composed of the first CAM cell array 1 and the first RAM cell array 2 to read data out of the cache memory composed of the second CAM cell array 3 and the second RAM cell array 4. None of the first and second predecoders 5a and 6a and the first and second row decoders 5 and 6 operate.

The non-inverted signal and inverted signal of an m-bit logical address assigned from the CPU are supplied to the first and second bit lines 16 and 17 both connected to the first CAM cell array 1 respectively, when the first CAM input circuit 41a operates. The first CAM cell array 1 compares a supplied logical address with its stored logical address, whereby outputting the result of the comparison onto the first sense line 9. If they (the two logical addresses) are found to be equal to each other (that is, it is found that the first CAM cell array 1 stores therein a logical address in agreement with a supplied logical address), the control circuit 7a drives the second word line 10, connected to the corresponding first RAM cell array 2, to "HIGH", on the basis of the "HIGH" potential of the first sense line 9 and the word line control signal on the control signal lines 26a. Then an n-bit physical address is read out of the first RAM cell array 2 selected, and the non-inverted signal and inverted signal of such an n-bit address are fed to the third bit line 27 and the fourth bit line 28, respectively.

Thus, the physical address, which has been read onto the third and fourth bit lines 27 and 28 from the first RAM cell array 2, is supplied through the first RAM I/O circuit 42a through the second CAM input circuit 43a to the fifth and sixth bit lines 18 and 19. In other words, the non-inverted signal and inverted signal of the n-bit physical address converted at the TLB are supplied onto the fifth and sixth bit lines 18 and 19. The second CAM cell array 3 compares a supplied physical address by way of the fifth and sixth bit lines 18 and 19 with its stored physical address, thereby outputting the result of the comparison onto the second sense line 12. If they (the two physical addresses) are found to be equal to each other (that is, it is found that the second CAM cell array 3 stores therein the physical address in agreement with the supplied physical address), the control circuit 7a drives the fourth word line 13, connected to the corresponding second RAM cell array 4, to "HIGH", on the basis of the "HIGH" potential of the second sense line 12 and the word line control signal on the control signal lines 26a. Then m-bit data is read out of the second RAM cell array 4 selected, and the non-inverted signal and inverted signal of such m-bit data are output to the seventh bit line 20 and the eighth bit line 21, respectively. Thus, the data, which has been read onto the seventh and eighth bit lines 20 and 21 from the second RAM cell array 4, is transferred to the CPU via the second RAM I/O circuit 44a.

In accordance with the first embodiment, the first RAM cell array 2 which is located in the TLB and serves as a transmitter of physical addresses, and the second CAM cell array 3 which serves as a cache tag memory (i.e., an "addressee" of such physical addresses) are arranged in close proximity. This arrangement allows physical addresses to travel a shorter distance. Thus, physical address transmission can be carried out at a high speed. Additionally, the integration of semiconductor memory device is improved as a result of the decrease of bit line wiring areas.

As is clear by comparison of FIG. 4 with FIG. 5, the organization of one CAM cell 22a requires more transistors than one RAM cell 23, which results in that the length of the CAM cell 22a inevitably becomes longer than that of the RAM cell 23, in the extending direction of the bit lines. In one entry of the TLB or the cache memory, the areas of the CAM cell arrays 1 and 3 are usually larger than those of the RAM cell arrays 2 and 4. For this reason, for two associative memories arranged at independent locations, there will be produced a waste of space on the part of the RAM cell arrays. On the contrary, the first embodiment of FIG. 2 shows such an arrangement that the CAM cell array 1 of the TLB and the RAM cell array 4 of the cache memory are located next to each other at the one side of the control circuit 7a, while the RAM cell array 2 of the TLB and the CAM cell array 3 of the cache memory are located next to each other at the other side of the control circuit 7a. The confined space can be effectively used, which allows the integration of semiconductor memory device to be much improved.

Further, in the first embodiment, although the first CAM cell array 1 and the second RAM cell array 4 are composed of m-bits while the first RAM cell array 2 and the second CAM cell array 3 are composed of n-bits, any one of m=n, m>n, and m<n may be applicable. The first CAM cell array 1 may be composed of a different number of bits from the second RAM cell array 4. Similarly, the first RAM cell array 2 may be composed of a different number of bits from the second CAM cell array 3. Also, the TLB may have a different number of entries from the cache memory, in which case the organization of the first embodiment will be applied only to portions making up part of words.

SECOND EMBODIMENT

FIGS. 8 through 12 show the semiconductor memory device with a TLB and a cache memory of the second embodiment of the invention. These figures are counterparts of FIGS. 2 through 7 of the first embodiment. The connection to a CPU is the same as that of FIG. 1. The organization of a RAM cell is the same as FIG. 4. With regard to the same elements as the first embodiment, the same reference numerals are assigned to them.

Figure 8:
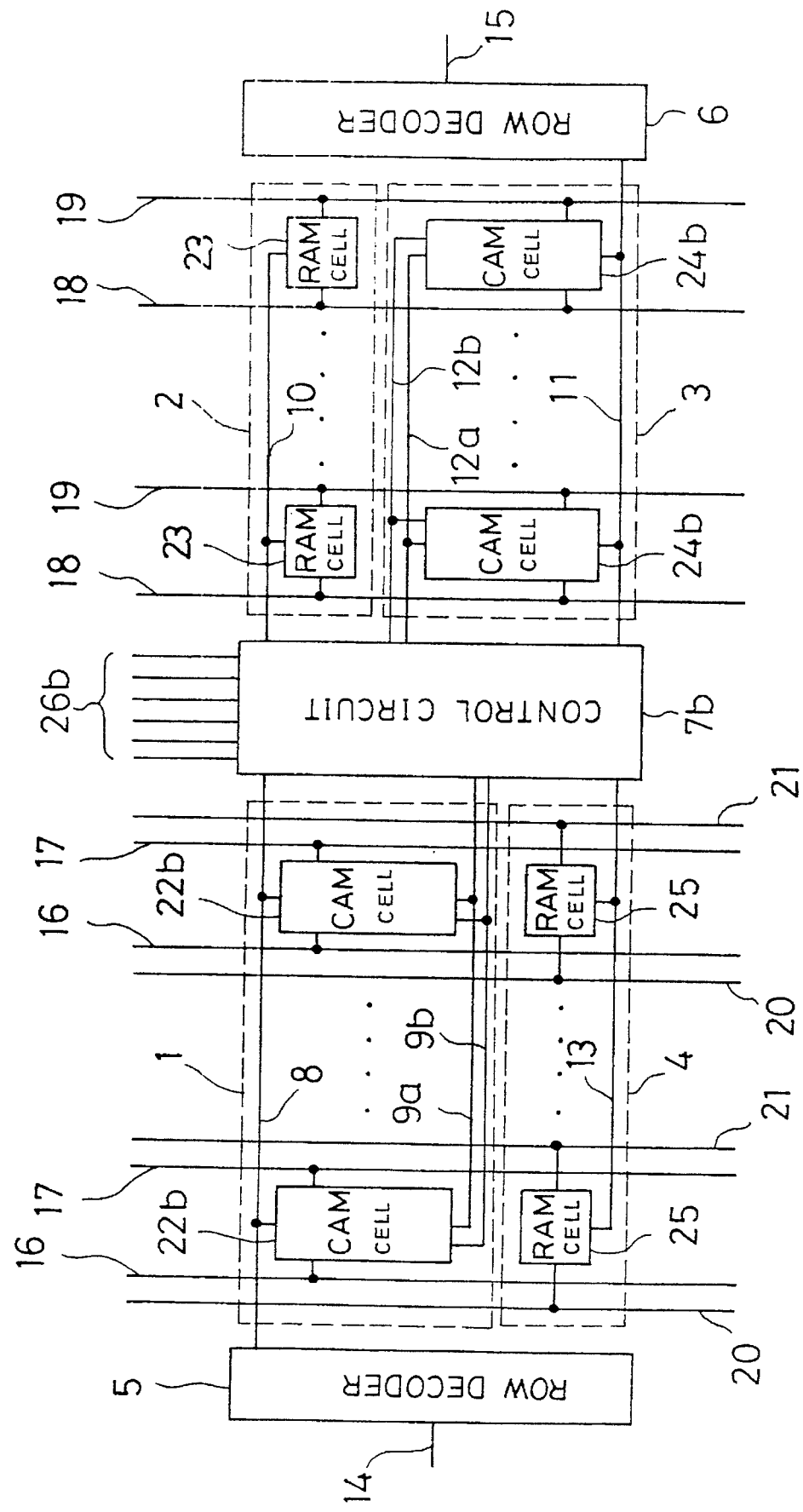
FIG. 8 is a block diagram showing the organization of one section composed of a combination of a TLB for one entry and a cache memory for one entry, in a semiconductor memory unit with a TLB and a cache memory of a second embodiment of the present invention.

In the second embodiment of FIG. 8, the second CAM cell array 3 shares the fifth and sixth bit lines 18 and 19 with the first RAM cell array 2. The internal organization of the CAM cell 22b making up each bit of the first CAM cell array 1 is different from the one as shown in the first embodiment. Connected to each one of the CAM cells 22b are the first and second bit lines 16 and 17, a first sense line 9a and a first imaginary ground line 9b. Like the first CAM cell array 1, each one of the CAM cells 24b making up each bit of the second CAM cell array 3 is connected to the fifth and sixth bit lines 18 and 19, a second sense line 12a and a second imaginary ground line 12b. Accordingly, the internal organization of the control circuit 7b and the configuration of the control signal lines 26b differ from those of the first embodiment. However, the arrangement that the CAM cell array 1 of the TLB and the RAM cell array 4 of the cache memory are located next to each other at the one side of the control circuit 7b while that the RAM cell array 2 of the TLB and the CAM cell array 3 of the cache memory are located next to each other is the same as FIG. 2.

Figure 9:
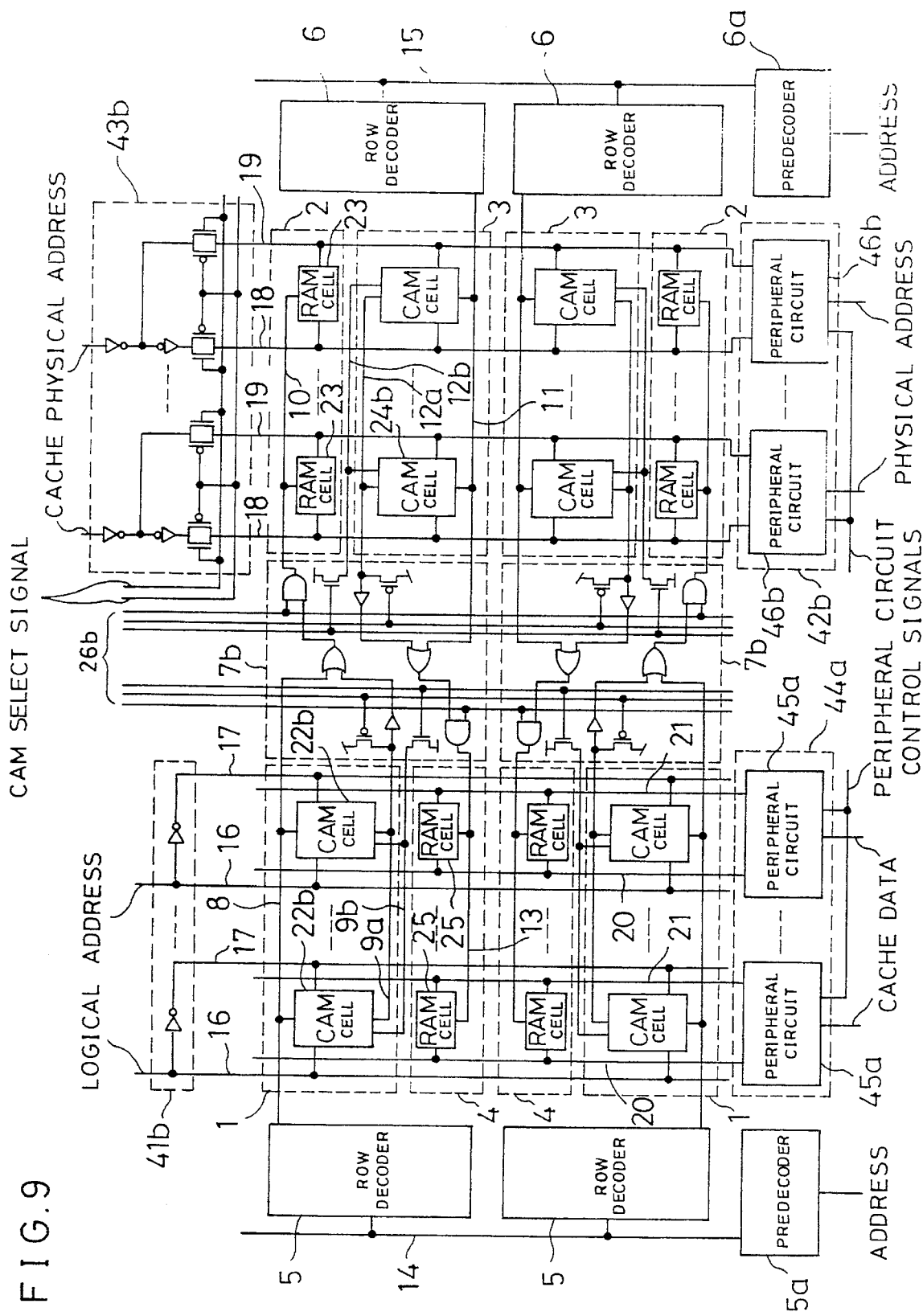
FIG. 9 is a block diagram showing the whole internal organization of the semiconductor memory unit of the second embodiment.
Figure 11:
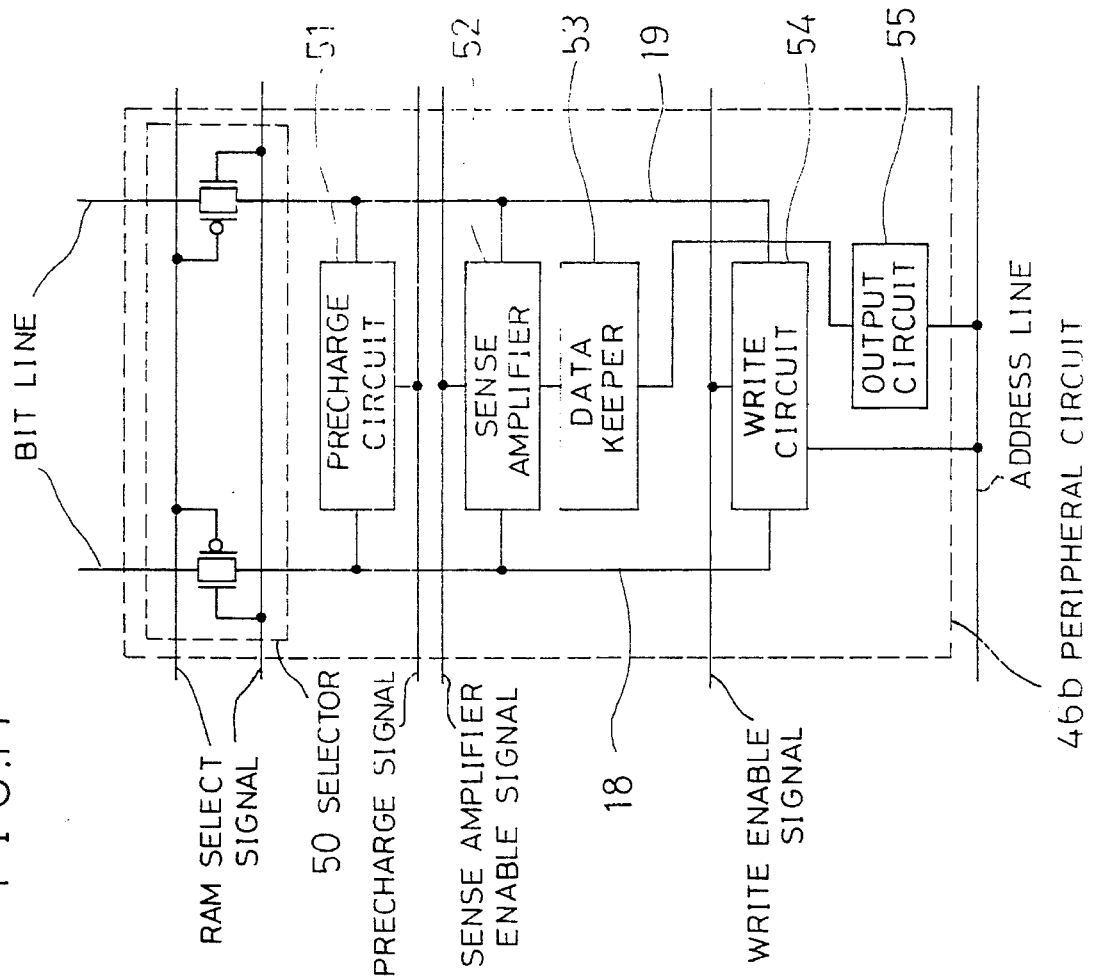
FIG. 11 is a block diagram showing the internal organization of a peripheral circuit for one bit of FIG. 9 for the readout and the write of the RAM cell.

The first RAM cell array 2 and the second CAM cell array 3 are so designed that they share the fifth and sixth bit lines 18 and 19, according to which the RAM I/O circuit 42b for the first RAM cell array 2, and the CAM input circuit 43b for the second CAM cell array 3 are changed in structure to include CMOS transfer gates each operating according to select signals, as shown in FIGS. 9 and 11, respectively. Further, due to the structure change of the CAM cell 22b, the organization of the CAM input circuit 41b for the first CAM cell array 1 is modified as well. Since the organization of the second RAM cell array 4 stays unchanged, the RAM I/O circuit 44a for the second RAM cell array 4 has the same organization as the first embodiment. Apart from the above, the other elements of FIG. 9 are the same as FIG. 3, however, physical addresses read onto the fifth and sixth bit lines 18 and 19 from the first RAM cell array 2 are directly supplied to the second CAM cell array 3.

Figure 10:
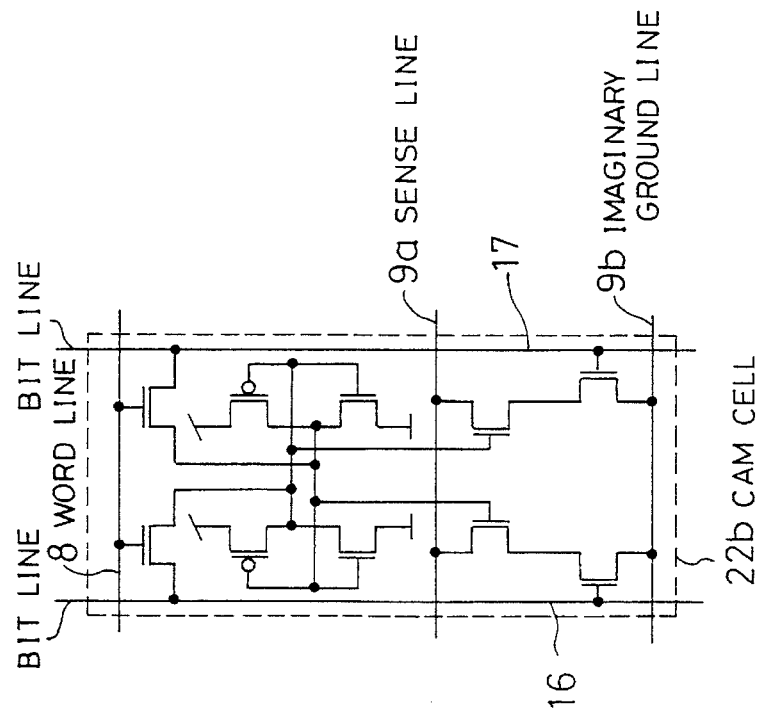
FIG. 10 is a circuit diagram showing the internal organization of a single CAM cell of FIGS. 8 and 9.

Referring to FIG. 10, the organization of the CAM cell 22b in the first CAM cell array 1 is described. The CAM cell 22b is the same as that of FIG. 5 in that it is of a 10-transistor construction but is different therefrom in that it is provided with the imaginary ground line 9b. The write operation is the same as FIG. 5. At the time of the comparing operation, the sense line 9a is first precharged to "HIGH" from outside, with the imaginary ground line 9b ungrounded. Then, after applying a potential difference for comparison between the two bit lines 16 and 17, the imaginary ground line 9b is brought to be in a grounded state so that a comparison of the information on the bit lines 16 and 17 with the information in the cell is carried out. If these two items of information are found to be equal to each other, which is called a hit, the potential of the sense line 9a remains "HIGH", whereas the potential of the sense line 9a becomes "LOW" if the two items disagree with each other, which is called a miss. The organization of the CAM cell 24b in the second CAM cell array 3 is the same as shown in FIG. 10.

The RAM I/O circuit 42b for access to the first RAM cell array 2 has n peripheral circuits 46b each having the organization as shown in FIG. 11. The peripheral circuit 46b of this embodiment is different from that of FIG. 6 in that it is provided with a selector 50 made up of CMOS transfer gates. The RAM select signal is issued to the selector 50, as one of the peripheral circuit control signals. At the time of the readout and write operations of the RAM cell 23 in the first RAM cell array 2 as well as at the time of the precharge of the fifth and sixth bit lines 18 and 19, the CMOS transfer gates of the selector 50 conduct so that the bit lines 18 and 19 are brought in connection with the precharge circuit 51, the sense amplifier 52, and the write circuit 54, which is a selective state. Conversely, the CMOS transfer gates of the second CAM input circuit 43b (see FIG. 9) conduct when the second CAM input circuit 43b is supplied with the CAM select signal for the write and comparing operations of the CAM cell 24b in the second CAM cell array 3. Then the selector 50 of FIG. 11 is in a non-selective state.

Figure 12:
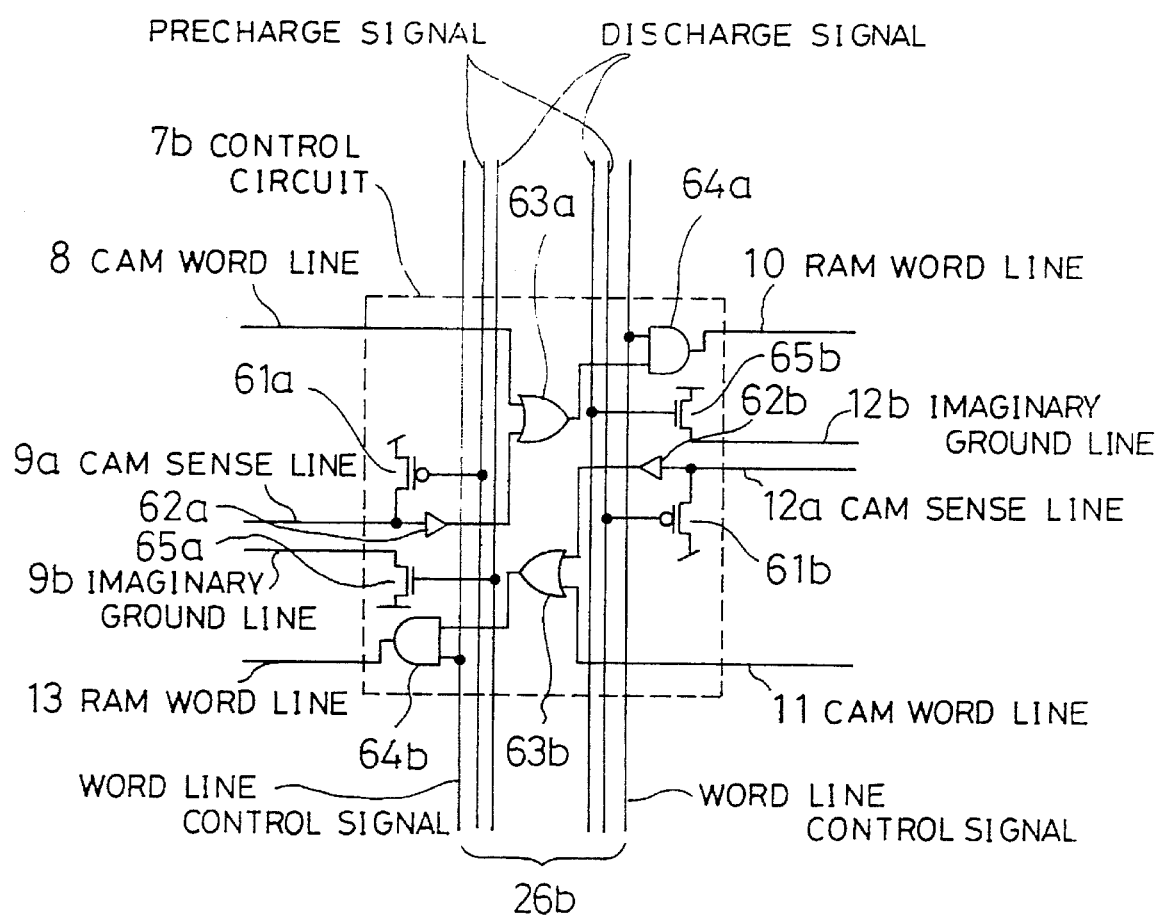
FIG. 12 is a circuit diagram showing the internal organization of a control circuit for one entry of FIGS. 8 and 9.

With reference to FIG. 12, the organization of the control circuit 7b for one section is illustrated. Under the control of plural signals on the control signal lines 26b, the control circuit 7b drives the word line 10 of the first RAM cell array 2 on the basis of a signal on the word line 8 or a signal on the sense line 9a of the first CAM cell array 1, and further drives the word line 13 of the second RAM cell array 4 on the basis of a signal on the word line 11 or a signal on the sense line 12a of the second CAM cell array 2. The control circuit 7b is composed of two PchMOSFET's 61a and 61b, two buffers 62a and 62b, two of OR gates 63a and 63b, two of AND gates 64a and 64b, and two of NchMOSFET's 65a and 65b. In other words, the control circuit 7b is composed of two pairs of identical circuits sharing precharge signals, discharge signals and word line control signals. The NchMOSFET 65a (65b) discharges the imaginary ground line 9b (12b) of the CAM cell to "LOW" on the basis of the discharge signal.

At the time of the write operation, the control circuit 7b transmits signals from the CAM word line 8 to the RAM word line 10 in the same way as FIG. 7. At the time of the comparing operation, the word line control signal is first brought to "LOW" to make the potential of the RAM word line 10 "LOW". Then the precharge signal and the discharge signal are brought to "LOW". Thus, the CAM sense line 9a is precharged through the PchMOSFET 61a. Next, the precharge signal and the word line control signal are brought to "HIGH", and then the discharge signal is brought to "HIGH" so that the imaginary ground line 9b is in a grounding state. As a result of this, a comparison of one logical address with another is performed in the first CAM cell array 1. If the CAM sense line 9a keeps being "HIGH" due to a hit in the first CAM cell array 1, the potential of the RAM word line 10 is raised to "HIGH" through the buffer 62a, through the OR gate 63a, and through the AND gate 64a. As a result, a hit word of the first RAM cell array 2 corresponding to a word of the first CAM cell array 1 is selected. Conversely, the miss of the first CAM cell array 1 lowers the potential of the CAM sense line 9a to "LOW". Thus, the aforesaid word of the first RAM cell array 2 is not selected. The signal transmission from the second CAM cell array 3 to the second RAM cell array 4 is carried out likewise.

Referring again to FIG. 9, the complete operation of the semiconductor memory device in accordance with this embodiment is detailed below.

Write operations to the first CAM cell array 1 and the first RAM cell array 2 which together make up the TLB are first described. At the time of the write operation to the first CAM cell array 1, both the first predecoder 5a, and the first row decoder 5 of each section operate to select a word to be written. When the first word line 8, connected to the first CAM cell array 1 of a certain section, is driven to "HIGH", the first CAM input circuit 41b operates so that the non-inverted signal and inverted signal of a logical address are supplied to the first bit line 16 and the second bit line 17, respectively. This results in the write of an m-bit logical address to the first CAM cell array 1 selected. Based on the "HIGH" signal on the first word line 8 and the word line control signal on the control signal lines 26b, the control circuit 7b drives the second word line 10 connected to the corresponding first RAM cell array 2, to "HIGH", while at the same time the non-inverted signal and inverted signal of a physical address are supplied through the write circuit of the first RAM I/O circuit 42b selected by the RAM select signal, to the fifth bit line 18 and the sixth bit line 19, respectively. As a result, an n-bit physical address is written to the first RAM cell array 2 selected. However, when the first RAM I/O circuit 42b is in a selective state, the second CAM input circuit 43b is brought to a non-selective state by the CAM select signal to avoid signal interference on the fifth and sixth bit lines 18 and 19.

Write operations to the second CAM cell array 3 and the second RAM cell array 4 which together make up the cache memory will be described. At the time of the write operation to the second CAM cell array 3, both the second predecoder 6a, and the second row decoder 6 of each section operate to select a word to be written. When the third word line 11, connected to the second CAM cell array 3 of a certain section, is driven to "HIGH", the second CAM input circuit 43b operates so that the non-inverted signal and inverted signal of a logical address as a tag are supplied to the fifth bit line 18 and the sixth bit line 19, respectively. This results in the write of an n-bit logical address to the second CAM cell array 3 selected. At the time that the second CAM input circuit 43b is in a selective state, the first RAM I/O circuit 42b is brought to a non-selective state by the RAM select signal to avoid signal interference on the fifth and sixth bit lines 18 and 19. Based on the "HIGH" signal on the third word line 11 and the word line control signal on the control signal lines 26b, the control circuit 7b drives the fourth word line 13 connected to the corresponding second RAM cell array 4, to "HIGH", while at the same time the non-inverted signal and inverted signal of data are supplied through the second RAM I/O circuit 44a, to the seventh bit line 20 and the eighth bit line 21, respectively. As a result, m-bit data is written to the second RAM cell array 4 selected.

Readout operation for reading data from the cache memory is described, which uses physical addresses converted from logical addresses in the TLB.

The non-inverted signal and inverted signal of an m-bit logical address assigned from the CPU are supplied to the first and second bit lines 16 and 17 both connected to the first CAM cell array 1 respectively, when the first CAM input circuit 41b operates. The first CAM cell array 1 compares a supplied logical address with its stored logical address thereby outputting the result of the comparison onto the first sense line 9a. If they (the two logical addresses) are found to be equal to each other, the control circuit 7b drives the second word line 10, connected to the corresponding first RAM cell array 2, to "HIGH", on the basis of the "HIGH" potential of the first sense line 9a and the word line control signal on the control signal lines 26b. Then an n-bit physical address is read out of the first RAM cell array 2 selected, and the non-inverted signal and inverted signal of such an n-bit address are supplied to the fifth bit line 18 and the sixth bit line 19, respectively.

Thus, the physical address, which has been read onto the fifth and sixth bit lines 18 and 19 from the first RAM cell array 2, is directly supplied to the second CAM cell array 3 by way of no external wiring. The second CAM cell array 3 compares a physical address supplied through the fifth and sixth bit lines 18 and 19 with its stored physical address, thereby outputting the result of the comparison onto the second sense line 12a. If they (the two physical addresses) are equal to each other, the control circuit 7b drives the fourth word line 13, connected to the corresponding second RAM cell array 4, to "HIGH", on the basis of the "HIGH" potential of the second sense line 12a and the word line control signal on the control signal lines 26b. Then m-bit data is read out of the second RAM cell array 4 selected, and the non-inverted signal and inverted signal of such m-bit data are supplied to the seventh bit line 20 and the eighth bit line 21, respectively. Thus, the data, which has been read onto the seventh and eighth bit lines 20 and 21 from the second RAM cell array 4, is transferred to the CPU via the second RAM I/O circuit 44a.

In accordance with this embodiment, the first RAM cell array 2 which is located in the TLB and serves as a transmitter of physical addresses, and the second CAM cell array 3 which serves as a cache tag memory (i.e., an "addressee" of such physical addresses) are configured so as to share the fifth and sixth bit lines 18 and 19. In comparison with the first embodiment, this arrangement allows physical addresses to travel a shorter distance, and physical address transmission can be carried out at a higher speed. Additionally, the integration of semiconductor memory device can be improved. Further, in accordance with this embodiment, capacitance due to bit lines can be reduced. Therefore, less power consumption is required.

Further, in the second embodiment, although the first CAM cell array 1 and the second RAM cell array 4 are composed of m-bits while the first RAN cell array 2 and the second CAM cell array 3 are composed of n-bits, any one of m=n, m>n, and m<n may be applicable. The first CAM cell array 1 may be composed of a different number of bits from the second RAM cell array 4. Similarly, the first RAM cell array 2 may be composed of a different number of bits from the second CAM cell array 3. Also, the TLB may have a different number of entries from the cache memory.

THIRD AND FOURTH EMBODIMENTS

Figure 13:
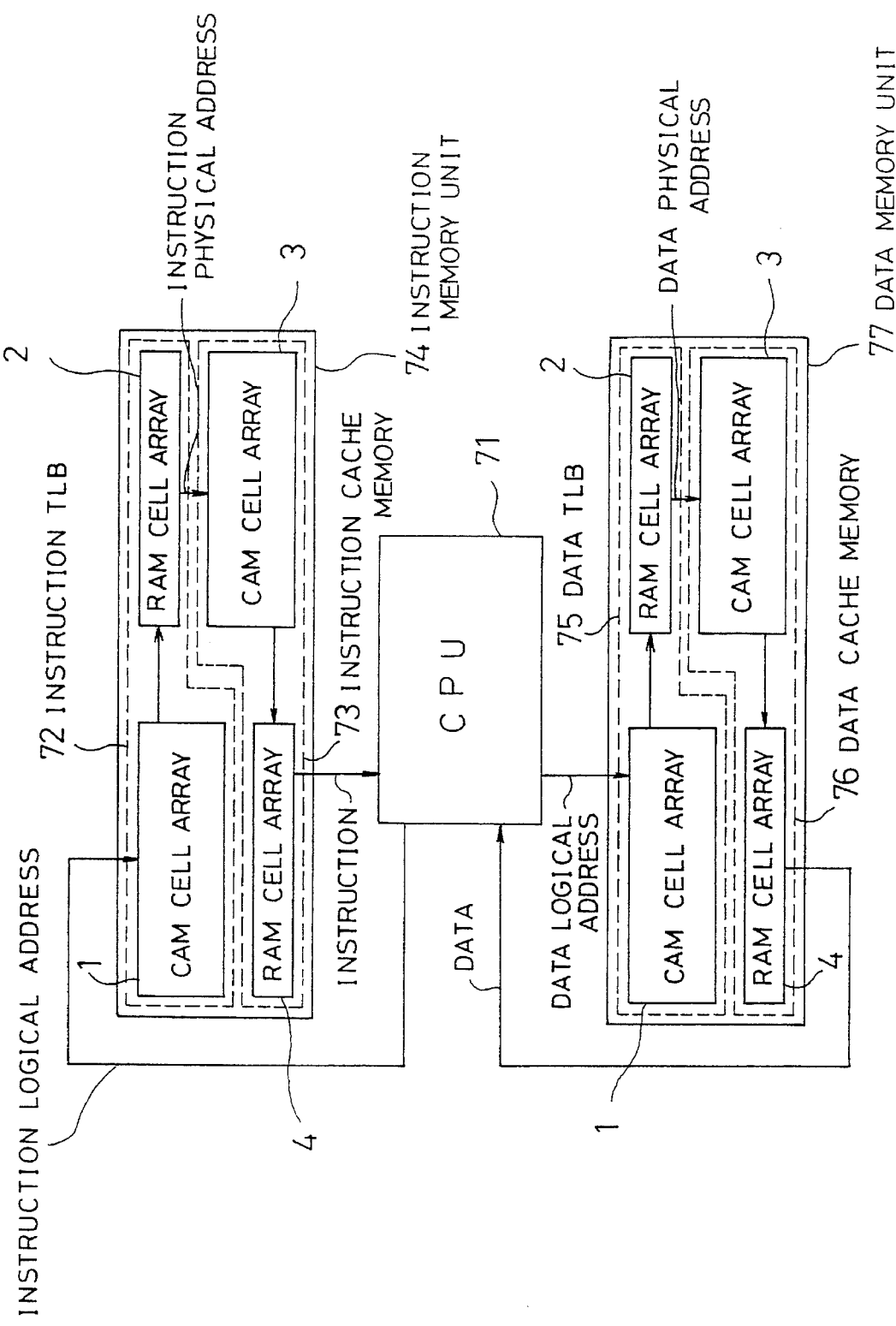
FIG. 13 is a block diagram, simplified, illustrating an MPU for the purpose of describing the functions of two semiconductor memory units in accordance with third and fourth embodiments of the present invention wherein the one semiconductor memory unit is provided with an instruction TLB and an instruction cache memory, while the other is provided with a data TLB and a data cache memory.

FIG. 13 shows an MPU. The MPU contains a CPU 71 having a function of distinctively outputting instruction logical addresses and data logical addresses, an instruction memory unit 74 as the semiconductor memory device of the third embodiment, and a data memory unit 77 as the semiconductor memory device of the fourth embodiment.

The instruction memory unit 74, which operates to return instructions to the CPU 71 according to instruction logical addresses issued by the CPU 71, includes an instruction TLB 72 and an instruction cache memory 73. The instruction TLB 72 is a first associative memory of full-associative system composed of the first CAM cell array 1 and the first RAM cell array 2. On the other hand, the instruction cache memory 73 is a second associative memory of full-associative system composed of the second CAM cell array 3 and the second RAM cell array 4. A combination of the instruction TLB 72 for one entry and the instruction cache memory 73 for one entry is one section of the Instruction memory unit 74. In other words, the first CAM cell array 1 and the first RAM cell array 2 are so arranged that they face each other across a control circuit, in the same way as in FIGS. 2 and 8. The second CAM cell array 3 and the second RAM cell array 4 are so arranged that they face each other across the control circuit. The second CAM cell array 3 is located next to the first RAM cell array 2, and the second RAM cell array 4 is located next to the first CAM cell array 1.

The data memory unit 77, which operates to return data to the CPU 71 according to data logical addresses issued by the CPU 71, includes a data TLB 75 and a data cache memory 76. The data TLB 75 is a first associative memory of full-associative system composed of the first CAM cell array 1 and the first RAM cell array 2. On the other hand, the data cache memory 76 is a second associative memory of full-associative system composed of the second CAM cell array 3 and the second RAM cell array 4. The data TLB 75 for one entry and the data cache memory 76 for one entry in the data memory unit 77 are arranged in the same way as for the instruction memory unit 74.

In accordance with these embodiments, the same benefits as the first and second embodiments can be obtained in the MPU that distinctively deals with the instruction logical address and the data logical address.

FIFTH AND SIXTH EMBODIMENTS

Figure 14:
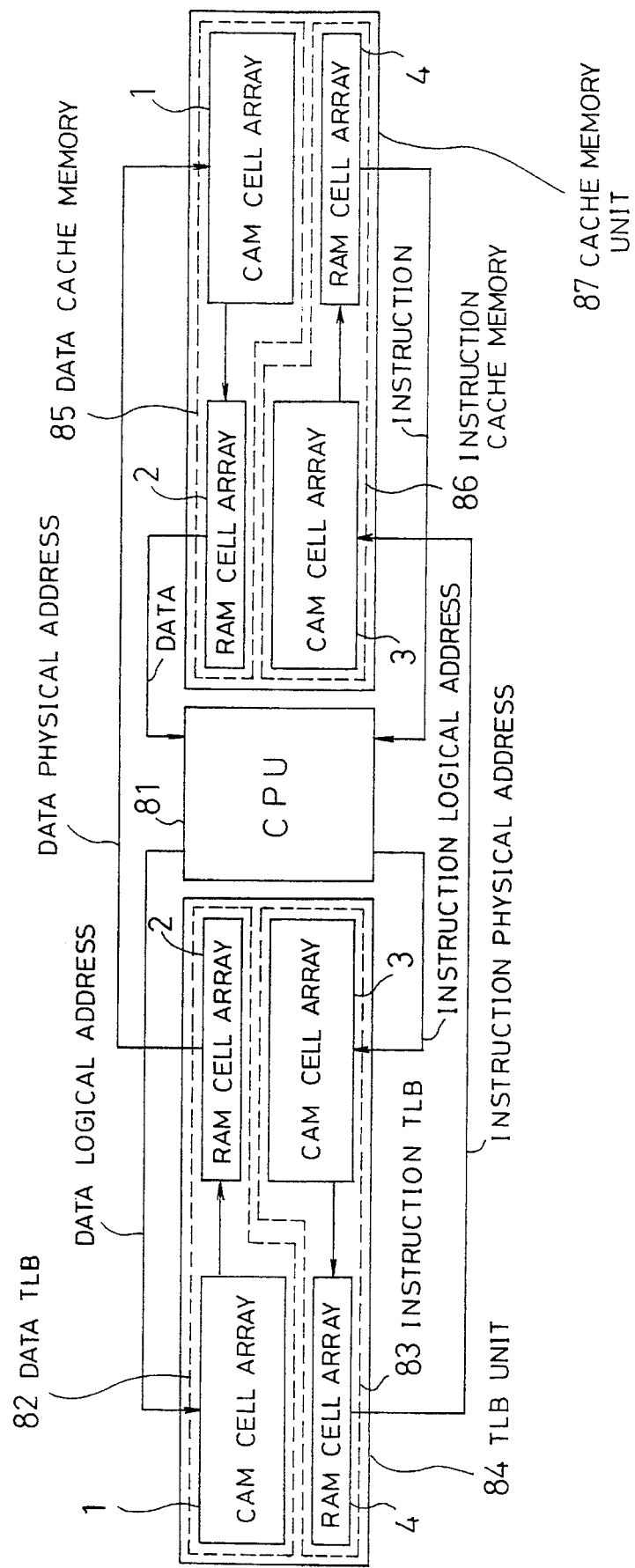
FIG. 14 is a block diagram, simplified, illustrating an MPU for the purpose of describing the functions of two semiconductor memory units in accordance with fifth and sixth embodiments of the present invention, wherein the one semiconductor memory unit is provided with an instruction TLB and a data TLB, while the other is provided with an instruction cache memory and a data cache memory.

FIG. 14 shows an MPU. Like the MPU of FIG. 13, this MPU contains a CPU 81 having a function of distinctively outputting instruction logical addresses and data logical addresses, a TLB unit 84 as the semiconductor memory device of the fifth embodiment, and a cache memory unit 87 as the semiconductor memory device of the sixth embodiment.

The TLB unit 84, which combines the function of supplying to the cache memory unit 87 instruction physical addresses according to instruction logical addresses issued by the CPU 81 with that of supplying to the cache memory unit 87 data physical addresses according to data logical addresses issued by the CPU 81, includes a data TLB 82 and an instruction TLB 83. The data TLB 82 is a first associative memory of full-associative system composed of the first CAM cell array 1 and the first RAM cell array 2. On the other hand, the instruction TLB 83 is a second associative memory of full-associative system composed of the second CAM cell array and the second RAM cell array 4. A combination of the instruction TLB 82 for one entry and the data TLB 83 for one entry makes up one section of the TLB unit 84. In other words, the first CAM cell array 1 and the second RAM cell array 4 are located next to each other on the one side of a control circuit, and the first RAM cell array 2 and the second CAM cell array 3 are located next to each other on the other side of the control circuit.

The cache memory unit 87, which combines the function of feeding to the CPU 81 instructions according to instruction physical addresses supplied from the TLB unit 84 with that of feeding to the CPU 81 data according to the data physical addresses supplied from the TLB unit 84, includes a data cache memory 85 and an instruction cache memory 86. The data cache memory 85 is a first associative memory of full-associative system composed of the first CAM cell array 1 and the first RAM cell array 2. On the other hand, the instruction cache memory 86 is a second associative memory of full-associative system composed of the second CAM cell array 3 and the second RAM cell array 4. The data cache memory 85 for one entry and the instruction cache memory 86 for one entry in the cache memory unit 87 are arranged in the same way as for the TLB unit 84.

In accordance with these embodiments, the same benefits as the first embodiment can be obtained in the MPU that distinctively deals with the instruction logical address and the data logical address.

We claim:

1. A semiconductor memory device comprising:

(1) first fully associative memory means having a content addressable memory cell array and a random access memory cell array, and (2) second fully associative memory means having a content addressable memory cell array and a random access memory cell array, wherein a combination of the first fully associative memory means for one entry and the second fully associative memory means for one entry makes up one unit, the unit comprising:

(a) a first content addressable memory cell array, as one part of said first fully associative memory means for one entry, having a plurality of content addressable memory cells which are connected to one of plural pairs of first bit lines respectively and further have common connection to a first word line that is driven at least at the time of write operation, and to a first sense line that is to be driven at the time of a hit, (b) a first random access memory cell array, as the other part of said first fully associative memory means for one entry, having a plurality of random access memory cells which are connected to one of plural pairs of second bit lines respectively and further have common connection to a second word line, (c) a second content addressable memory cell array, as one part of said second fully associative memory means for one entry, having a plurality of content addressable memory cells which are connected to one of plural pairs of third bit lines respectively and further have common connection to a third word line that is driven at least at the time of write operation, and to a second sense line that is to be driven at the time of a hit, (d) a second random access memory cell array, as the other part of said second fully associative memory means for one entry, having a plurality of random access memory cells which are connected to one of plural pairs of fourth bit lines respectively and further have common connection to a fourth word line, and (e) control means which drives the second word line on the basis of a signal on the first word line or a signal on the first sense line for access to said first random access memory cell array through the plural pairs of second bit lines, and further drives the fourth word line on the basis of a signal on the third word line or a signal on the second sense line for access to said second random access memory cell array through the plural pairs of fourth bit lines, said first content addressable memory cell array and said first random access memory cell array are so arranged that they face each other across said control means, and said second content addressable memory cell array and said second random access memory cell array are so arranged that they face each other across said control means, and said second content addressable memory cell array is located next to said first random access memory cell array while said second random access memory cell array is located next to said first content addressable memory cell array.

2. The semiconductor memory device of claim 1, wherein said unit further includes:

(a) a first decoder which drives the first word line to enable write operation to said first content addressable memory cell array through the plural pairs of first bit lines, and (b) a second decoder which drives the third word line to enable write operation to said second content addressable memory cell array through the plural pairs of third bit lines.

3. The semiconductor memory device of claim 1, wherein one of said first and second fully associative memory means serves as a translation look-aside buffer while the other serves as a cache memory.

4. The semiconductor memory device of claim 1, wherein said first fully associative memory means serves as a translation look-aside buffer while said second fully associative memory means serves as a cache memory.

5. The semiconductor memory device of claim 1, wherein said first random access memory cell array and said second content addressable memory cell array share the same pairs of signal lines, as the pairs of the second and third bit lines.

6. The semiconductor memory device of claim 5, wherein said first fully associative memory means serves as a translation look-aside buffer while said second fully associative memory means serves as a cache memory.

7. The semiconductor memory device of claim 1, wherein one of said first and second fully associative memory means serves as an instruction translation look-aside buffer while the other serves as a data translation look-aside buffer.

8. The semiconductor memory device of claim 1, wherein one of said first and second fully associative memory means serves as an instruction cache memory while the other serves as a data cache memory.

* * * * *